United States Patent [19]  
Ishii et al.

[11] Patent Number: 5,242,540  
[45] Date of Patent: Sep. 7, 1993

[54] PROCESS FOR PRODUCING THIN COPPER FOIL-CLAD CIRCUIT BOARD SUBSTRATE

[75] Inventors: Kenji Ishii; Takamasa Nakai; Hiroyuki Matsumoto, all of Tokyo; Kenichi Moriyama, Kanagawa, all of Japan

[73] Assignee: Mitsubishi Gas Chemical Co., Inc., Tokyo, Japan

[21] Appl. No.: 833,448

[22] Filed: Feb. 6, 1992

[30] Foreign Application Priority Data

Feb. 18, 1991 [JP] Japan ................... 3-044071

[51] Int. Cl.[5] ............................ C23F 1/00; B44C 1/22
[52] U.S. Cl. ................................... 156/645; 156/656; 156/666; 156/902; 252/79.4
[58] Field of Search ............... 156/630, 634, 636, 645, 156/651, 656, 666, 901, 902; 252/79.2, 79.4

[56] References Cited

U.S. PATENT DOCUMENTS 4,917,758  4/1990  Ishizuka et al. ............... 156/645 X
4,994,139  2/1991  Biermann et al. ............. 156/645 X Primary Examiner—William A. Powell
Attorney, Agent, or Firm—Sughrue, Mion, Zinn, Macpeak & Seas

[57] ABSTRACT

A process for producing a thin copper foil-clad circuit board substrate which comprises subjecting a copper foil-clad circuit board substrate (a) comprising an electrically insulating support overlaid on one or both sides with a copper foil having an average thickness of 12 μm or more to etching with a copper-etching solution thereby to etch the whole surface of the copper foil at a predetermined etching rate selected from the range of from 0.01 to 0.4 μm/sec, thereby to reduce the thickness of the copper foil on at least one side of the insulating support to 10 to 80% of its original thickness with the thickness variation of the remaining etched copper foil being within ±1.0 μm on the basis of a desired thickness, wherein said copper foil-clad circuit board substrate (a) is one in which the surface of the copper foil is substantially free of adherent dust particles having an average particle diameter of 3 μm or more.

5 Claims, No Drawings

PROCESS FOR PRODUCING THIN COPPER FOIL-CLAD CIRCUIT BOARD SUBSTRATE

FIELD OF THE INVENTION

The present invention relates to an improved process for producing a thin copper foil-clad circuit board substrate through etching. More particularly, the present invention relates to a process for producing a thin copper foil-clad circuit board substrate free of minute projections of the order of up to several micrometers which are formed in conventional processes using conventional copper foil-clad circuit board substrates, by using a copper foil-clad circuit board substrate substantially free of adherent dust particles on the surface thereof.

BACKGROUND OF THE INVENTION

The present inventors previously proposed processes for producing a thin copper foil-clad circuit board substrate in, for example, JP-A-2-60189, JP-A-2-25090, JP-A-2-25089, JP-A-2-22896, JP-A-2-22887 and JP-A-2-97688. (The term "JP-A" as used herein means an "unexamined published Japanese patent application".)

These processes enable the industrial production of thin copper foil-clad circuit board substrates having high thickness precision. However, a close examination of the surfaces of the copper foils in thin copper foil-clad circuit board substrates obtained by these processes has revealed that there are projections of several micrometers or smaller which are unevenly distributed over the surface.

Such projections have been observed even on the copper foil surfaces of thin copper foil-clad circuit board substrates produced using copper foil-clad circuit board substrates of the best quality. The cause of this was investigated and, as a result, it has been ascertained that even such a high-quality copper foil-clad circuit board substrate has adherent dust particles on the copper foil surface thereof, which mainly comprise resin powder particles and have an average particle diameter of from 3 to 10 $\mu$m in most cases and which are unevenly distributed over the surface, and that at least part of these adherent dust particles function as a resist during the etching of the whole copper foil surface to form the projections.

Although such projections do not substantially give an adverse influence in the formation of conventional circuits, particularly in the case of forming fine circuit patterns, there have been the problems that the resist on the projection becomes thinner than other portion or since the adhesion is poor, the resist peels off at etching and the copper foil at that portion is removed. Thus, the projections become a cause of defect development.

SUMMARY OF THE INVENTION

An object of the present invention is to provide a process for producing a thin copper foil-clad circuit board substrate free of such projections by means of a precision etching technique.

The present invention provides a process for producing a thin copper foil-clad circuit board substrate which comprises subjecting a copper foil-clad circuit board substrate (a) comprising an electrically insulating support overlaid on one or both sides with a copper foil having an average thickness of 12 $\mu$m or more to etching with a copper-etching solution thereby to etch the whole surface of the copper foil at a predetermined etching rate selected from the range of from 0.01 to 0.4 $\mu$m/sec, thereby to reduce the thickness of the copper foil on at least one side of the insulating support to 10 to 80% of its original thickness with the thickness fluctuation of the remaining etched copper foil being within ±1.0 $\mu$m on the basis of a desired thickness, wherein the copper foil-clad circuit board substrate (a) is one in which the surface of the copper foil is substantially free of adherent dust particles having particle diameters of 3 $\mu$m or more.

In preferred embodiments of the above process of the present invention, the copper foil-clad circuit board substrate (a) is one from which adherent dust particles have been removed by a surface-polishing treatment comprising at least two steps; the thickness of copper removed by the surface-polishing treatment is 2 $\mu$m or less; at least the first step in the surface-polishing treatment is a mechanical polishing treatment; the mechanical polishing treatment is polishing with a #600–1,000 compressed pad brush; and the final step in the surface-polishing treatment is polishing with a #1,000–1,200 compressed pad brush or polishing with a jet scrubber employing a #180–400 abrasive material.

DETAILED DESCRIPTION OF THE INVENTION

The abrasive number in the polishing treatment used herein is according to JIS R 6001 (1987) (Japanese Industrial Standards). There are manufacturer standards and FEPA standards as other conventional standards. The relationships between JIS standard and the other conventional standards are shown below.

| JIS | 3M | PS | NEW FEPA |
| --- | --- | --- | --- |
| #240 | F | #220–240 | #240 |
| #320 | VF | #240–280 | #320 |
| #600 | SF | #360–400 | #600 |
| #800 | | #500 | #1000 |
| #1000 | UF | #600 | #1200 |
| #1500 | EXF | | |
| #2500 | | | |

The copper foil-clad circuit board substrate which comprises an electrically insulating support overlaid on one or both sides with a copper foil and which is used as the copper foil-clad circuit board substrate (a) in the process of the present invention after the removal of dust particles therefrom is not particularly limited as long as the copper foil used therein has an average thickness of 12 $\mu$m or more and the thickness fluctuation of the copper foil on the basis of the average thickness is within ±1.0 $\mu$m. For example, various kinds of the commercially available copper foil-clad circuit board substrates for use in producing electronic or electrical parts can be used as the copper foil-clad circuit board substrate. Specific examples thereof include single-side or double-side copper-clad films, sheets, fiber-reinforced insulating resin laminates, metal-core laminates, multilayered shield boards having an inner-layer printed circuit, and the like.

Examples of the electrically insulating support include a film or sheet made of a polyimide resin, polyester resin, or the like; an insulating support prepared using a prepreg which is a combination of a thermosetting resin or a heat-resistant thermoplastic resin and a reinforcing material in the form of a porous film or sheet prepared from fibers, a chopped reinforcement, or the like made of one or a suitable combination of two or more materials selected from glasses (E-glass, D-glass, S-glass, SII-glass, T-glass, L-glass, A-glass, C-glass silica glass (quartz), etc.), ceramics (alumina, boron nitride, etc.), heat-resistant engineering plastics (all-aromatic polyamides, polyimides, semi-carbon, fluoroplastics, etc.), and the like; and an insulating support prepared by covering an iron or aluminum plate or the like with an adhesive or adhesive film having insulating properties. For preparing a copper-clad laminate or sheet in which the copper foil is as thin as 12 to 16 $\mu$m, a preferred method is to conduct laminating while a sheet having a thickness of about 40-100 $\mu$m and a higher thermal expansion coefficient than the copper foil, e.g., aluminum foil, is placed between the copper foil and a stainless steel mirror plate having a thickness of 2 mm.

In the present invention, a copper foil-clad circuit board substrate in which the surface of the copper foil is substantially free of adherent dust particles having a particle diameter of 3 $\mu$m or more is used as the copper foil-clad circuit board substrate (a). In general, such a copper foil-clad circuit board substrate is not commercially available. After adherent dust particles are removed, the copper foil-clad circuit board substrate is subjected, in the present invention, to precision etching in which the whole copper foil surface is etched while preventing re-adhesion of adherent dust particles present in the working atmosphere or other sources to the cleaned copper foil surface.

Generally used techniques for the removal of such adherent dust particles include mechanical or physical polishing techniques such as roll polishing, brushing with compressed pad brush, pumice scrubbing, jet scrubber polishing, bristle brush polishing, hand polishing, and the like; chemical polishing techniques employing a desmearing liquid as used in, for example, through-hole plating processes, a chemically polishing liquid, an acidic emulsion solution, or other chemical solutions; combinations of these chemical polishing techniques and ultrasonic vibration or the like; and combinations of mechanical polishing techniques and chemical polishing techniques.

The method of the polishing treatment is not particularly limited as long as polishing conditions are properly selected and maintained such that adherent dust particles having a particle diameter of 3 $\mu$m or larger, preferably 2 $\mu$m or larger, are removed and a scratch having a depth of 5 $\mu$m or more, preferably 3 $\mu$m or more, more preferably 2 $\mu$m or more, does not result from the polishing. This is because if a scratch is formed by polishing and this scratch is to be removed by the subsequent precision etching treatment, not only it is necessary to remove a surface layer of the copper foil at a thickness of at least two times the depth of the scratch, but there are cases where removal of the scratch by the etching is impossible. It is preferred that from the standpoint of imparting high copper foil thickness precision to the thin copper foil-clad circuit board substrate to be produced, the copper foil thickness removed by the polishing is 2 $\mu$m or less.

From the standpoint of production efficiency and reliability (continuously treating a large quantity of copper foil-clad circuit board substrates and making all the substrates substantially free of adherent dust particles), the polishing treatment is preferably carried out by a method comprising at least two steps and, in this case, the particularly preferred first step is a mechanical polishing.

Examples of the mechanical polishing as the first step include polishing with a #600-1,000 compressed pad brush, polishing with a jet scrubber employing a #100-220 abrasive material of the alumina-based type, silicon carbide type, or the like, polishing with a bristle brush, polishing by brush washing, polishing by polisher washing using a cotton abrasive or wool abrasive, and the like. The final step in the polishing treatment is carried out, for example, by mechanical polishing such as polishing with a #1,000-1,200 compressed bad brush or with a jet scrubber employing a #180-400 abrasive material; polishing by chemical cleaning using a desmearing liquid, chemically polishing liquid, acidic emulsion solution, or the like; or a method in which any of these chemical-cleaning polishing techniques is conducted in an ultrasonic cleaning device or the like. It is also preferred that the copper foil-clad circuit board substrate is treated, in the first-step polishing, with a desmearing liquid to remove adherent resinous dust particles substantially completely and, thereafter, mechanical polishing as described above is conducted as the final step.

The polishing machine used in the mechanical polishing is a conventional horizontal or vertical wet-polishing machine.

In the case of using a brush, the direction of the revolution of the brush can be either the same as or the reverse of the conveyor direction. However, use of a brush which reciprocally revolves in both directions is preferred. The number of revolutions of the brush is regulated such that the circumferential speed of the brush is in the range of from 600 to 1,200 m/min. The brushing pressure is regulated such that the whole copper foil surface is uniformly brushed and that the copper foil thickness removed by this polishing is 2 $\mu$m or less and the brushing does not cause the copper foil surface to partially have scratches or other defects. It is preferred to use a polishing machine having an oscillation mechanism and, in this case, the stroke and the oscillation frequency are preferably selected in the ranges of from 5 to 15 mm and from 100 to 500 cycles per minute, respectively.

In the case of jet scrubber polishing, it is carried out by jetting a dispersion of an alumina-based or silicon carbide-based abrasive material or other abrasive material in water or other medium onto the copper foil surface at a pump pressure of 1 to 3 kg/cm$^2$.

The thus-obtained copper foil-clad circuit board substrate (a) in which the surface of the copper foil is substantially free of adherent dust particles having a particle diameter of 3 $\mu$m or more is then subjected to etching using the method previously proposed by the present inventors and other methods to precisely etch the whole surface of the copper foil, thereby to produce a thin copper foil-clad circuit board substrate.

The copper-etching solution used in the present invention for the etching of the copper foil-clad circuit board substrate (a) is an aqueous solution containing hydrogen peroxide/sulfuric acid, copper chloride, a persulfate, iron chloride, or the like as a major component. The etching rate is kept low in the present invention by keeping the concentration of the etching agent low as compared with those in usually employed etching solutions, by keeping the etching temperature low, or by reducing the amount of the etching solution which contacts with the copper foil surface (reducing the spray pressure in the case of spray etching) while maintaining uniformity of the contact over the surface, or by using a suitable combination of these methods. Thus, in the present invention, a predetermined etching rate is maintained which is selected from the range of from 0.01 to 0.4 μm/sec, preferably from 0.01 to 0.3 μm/sec, more preferably from 0.03 to 0.2 μm/sec, and most preferably from 0.05 to 0.11 μm/sec.

Preferred etching solutions for use in the present invention are etching solutions containing both hydrogen peroxide and sulfuric acid and etching solutions containing copper chloride. Etching rates higher than 0.4 μm/sec are not preferred in that not only the resulting etched copper foil is apt to have a thickness considerably different from the desired value because etching proceeds to different degrees even depending on a slight difference in the etching treatment time, but also such a high etching rate tends to result in increased thickness fluctuations over the etched surface and, hence, it becomes difficult to obtain a thin copper foil-clad circuit board substrate in which the thickness fluctuation of the etched copper foil is within ±1.0 μm on the basis of the desired thickness. On the other hand, etching rates below 0.01 μm/sec are not preferred in that the etching requires too much time and is hence unpractical.

In the case of using a copper-etching solution containing hydrogen peroxide and sulfuric acid, etching is conducted at a hydrogen peroxide concentration of 1.5-4 w/v %, a sulfuric acid concentration of 3-7 w/v %, and a copper concentration of 10-100 g/l at a temperature between 25° and 60° C., while fluctuations in the concentration of each of these ingredients are kept within ±1.0% based on a predetermined value and fluctuations in etching temperature are kept within ±1.0 degree.

Additives such as a stabilizer for hydrogen peroxide, a brightener for copper, and the like can suitably be added to the above etching solution. Examples of such additives include monohydric alcohols such as methanol, ethanol, propanol, and butanol; dihydric alcohols such as ethylene glycol, propylene glycol, butanediol, and pentanediol; and trihydric and other polyhydric alcohols such as glycerin and pentaerythritol. In the case of using a copper-etching solution containing copper chloride, etching is conducted at a cupric chloride concentration of 0.25-3 mol/l and a hydrochloric acid concentration of 1-5 mol/l at a temperature between 25° and 55° C., while fluctuations in hydrochloric acid concentration are kept within ±0.3 mol/l based on a predetermined value and fluctuations in etching temperature are kept within ±5.0 degrees. The latter etching solution containing cupric chloride is preferred particularly when the resulting etched substrate is subjected on-site as it is to a subsequent processing step. For example, the copper foil-clad circuit board substrate treated with the etching solution containing cupric chloride may be then further treated with the above-described copper-etching solution containing hydrogen peroxide and sulfuric acid or with a chemically polishing liquid.

As the etching apparatus, an existing etching machine for pattern formation can be used in which etching is conducted by spraying a copper-etching solution on substrates which are being conveyed while holding the same horizontal, oblique, or vertical. It is especially preferable in the present invention to conduct the etching while conveying the copper foil-clad circuit board substrate (a) in a vertically held state (i.e., vertical etching method; vertical etching machine). It is also preferred to use an apparatus in which cleaning, anti-corrosive treatment, and drying are continuously conducted immediately after completion of the etching.

A preferred example of the vertical etching machine comprises a conveyor part (A) for conveying copper foil-clad circuit board substrates (a) and a nozzle part (B) comprising a plurality of spraying nozzles (5) disposed along and on both sides of the space through which vertically held copper foil-clad circuit board substrates (a) are to be moved (conveyance space). The conveyor part (A) comprises a roller part (3) for nipping and sending copper foil-clad circuit board substrates (a) and substrate (a)-supporting rollers (4) which have been arranged at the lower end of the roller part (3) along the conveyance space. The roller part (3) comprises a plurality of rollers (2) which are driven by a driving means for sending (1) disposed along the upper end of the conveyance space and have been arranged on both sides of and along the lower part of the conveyance space almost throughout the conveyance space length in such a manner that both rollers in each roller pair face each other with their axes vertical. It is preferred that the supporting rollers (4) be driven at the same substrate-sending speed as that of the rollers (2) by a driving shaft (6) disposed along one side of the conveyance space.

Although etching conditions for this vertical etching machine vary depending on the conveying speed for copper foil-clad circuit board substrates (a), the etching solution used, and the like, it is particularly preferred that the spray pressure is selected from the range of 0.3-1.3 kg/cm$^2$, preferably 0.3-0.8 kg/cm$^2$, more preferably 0.4-0.8 kg/cm$^2$. These preferred spray pressures are lower than the spray pressures in conventional pattern etching and those for conventional vertical etching machines. Since such low spray pressures can be used in the vertical etching machine, even substrates as thin as about 0.1 mm can be etched substantially without causing the substrates to sway due to spraying, so that the substrates can be conveyed more easily and etched more uniformly.

A method for obtaining a desired copper foil thickness through etching with a certain etching solution is to measure the etching rate for the etching solution under predetermined etching conditions (the kind and concentration of the etching solution, temperature, spray pressure, conveying speed for substrate (a), etc.), fix the etching time based on this measurement, and regulate the etching solution so as to maintain the etching rate. For example, in the case where the copper foils on both sides are to be etched to remove copper at the same thickness for both sides, etching is conducted at the same spray pressure for both sides for a predetermined time period. In order to obtain etched copper foils having different desired thicknesses, a method is used in which the etching rate for one side and that for the other side are set in a desired ratio by controlling each etching rate within the desired range by changing the spray pressure for each side or the number of spray nozzles used for each side, especially by changing the number of spray nozzles. Other methods for obtaining through etching a thin copper foil-clad circuit board substrate in which the copper foils on both sides have different thicknesses include: a method in which a substrate overlaid on one side with a 35 μm-thick electrodeposited copper foil and on the other side with a 18 μm-thick electrodeposited copper foil is, for example, used as the double-side copper-clad circuit board substrate to be subjected to etching and the both surfaces are etched at the same etching rate; a method in which a substrate overlaid on both sides with a 18 μm-thick electrodeposited copper foil is used, with the whole surface of one side or, particularly, the edges of one side, being covered with a releasable protective film such as a plastic film, and only the other uncovered surface is etched; and a method in which a double-side copper-clad circuit board substrate is subjected to etching while keeping the substrate vertical. Further, in order to completely remove the copper foil on one side and reduce the thickness of the copper foil on the other side to a desired small value, the above-described methods for obtaining an etched substrate in which the copper foils on both sides have different thicknesses can be used, provided that the etching rate for the side where the copper foil is to be removed completely is set at a value far larger than those as described hereinabove.

For the cleaning of the etched copper foil, a known technique for removing impurities, such as neutralization, acid cleaning, water rinsing, hot water rinsing, or the like can be used, and the copper-etching solution used, the stabilizer therefor, and other ingredients are taken in account when selecting a suitable cleaning technique. In a preferred cleaning method, the copper foil surface is first cleaned with a weakly acidic aqueous solution or water at ordinary temperature or with heating, cleaned with an acid, and then subjected to neutralization treatment with a 1-5 wt % aqueous solution of sodium carbonate at 20° to 50° C. Anti-corrosive treatment may then be conducted in which the cleaned copper foil is preferably treated at 20° to 50° C. with an aqueous solution which contains from 0.01 to 1 wt % of a conventional anti-corrosive agent for copper and to which a surfactant and other additives have further been suitably added. Usually, the thus-treated copper foil is then dried, for example, by blowing hot air against the foil.

It is preferred that after the anti-corrosive and drying treatments, the copper foil surface is covered with a protective film by applying, under pressure, a film or photoresist film made of a strippable resin such as polyethylene, polypropylene, an ethylene-propylene resin, an ethylene-vinyl acetate resin, poly(vinylidene chloride), an acrylate copolymer, a 1,2-polybutadiene resin, a polyester resin, or other thermoplastic resins, or by coating the copper foil surface with a resin soluble in general-purpose solvents, such as paraffin wax, polyethylene wax, rosin, or low molecular weight polystyrene, or with a photoresist resin syrup.

As described above and as will be demonstrated by the following Example, according to the process of the present invention which comprises etching a copper foil-clad circuit board substrate (a) in which the copper foil surface is substantially free of adherent dust particles having a particle diameter of 3 μm or more, thin copper foil-clad substrates not only having excellent average thickness precision but also substantially free of partially distributed projections of up to about several micrometers can be produced at extremely good efficiency. By using the thus-obtained thin copper foil-clad substrates, printed circuit boards having finer printed circuits can be produced with higher reliability. Therefore, the present invention is of considerable industrial significance.

The present invention will be explained below in more detail with reference to the following Example, but the invention should not be construed as being limited thereto.

EXAMPLE

Ten glass cloth-reinforced epoxy resin laminates each having a size of 500 mm by 500 mm and a thickness of 1.6 mm and overlaid on both sides with a copper foil having an average thickness of 18 μm were subjected to various cleaning treatments as specified below.

(1) Polishing with a compressed pad brush brusing machine (both-side oscillation type polishing machine, manufactured by Ishii Hyoki Co., Ltd., Japan)
  Compressed pad brush used: #600 (L 600 mm)
  Brush pressure (load current): 9-10 A
  Brushing width in the machine direction of the laminate: 10-15 mm
  Oscillation frequency: 480 cycles per min
  Conveyor speed: 2 m/min (2) Polishing with a jet scrubber polishing machine (manufactured by Ishii Hyoki Co., Ltd.)
  Abrasive material: SAKURANDAM #220, manufactured by Japan Carlit Co., Ltd.
  Abrasive material amount: 20% (20% slurry prepared by suspending 100 ml abrasive material in 400 ml water to fill 500 ml measuring flask)
  Conveyor speed: 1-3 m/min
  Slurry pressure: 2.0 kg/cm$^2$
  Treating time: 40 sec to 2 min (3) Polishing by desmearing treatment
  Treating liquid: $KMnO_4$ 50±10 g/l
  treating temperature: 75°±5° C.
  Treating time: 7-10 min Before and after the cleaning treatment, the copper foil surfaces in each copper-clad laminate was examined for the presence of dust particles having a diameter of from 3 to 10 μm. Further, the copper foil thickness reduction through the treatment was also measured.

The results obtained are shown in the Table below.

TABLE

|  | Uncleaned substrate | The number of dust particles Cleaning treatment |  |  |  |  |
|---|---|---|---|---|---|---|
|  |  | (1) | (3) | (1) + (2) | (1) + (3) | (3) + (2) |
| Kind of dust |  |  |  |  |  |  |
| Adherent resin | 15-33 | 5-15 | 0 | 0 | 0 | 0 |
| Adherent foreign substance | 0-5 | 0-2 | 0-5 | 0 | 0 | 0 |
| Adherent stain | 30-100 | 10-50 | 20-70 | 0 | 0-10 | 0 |
| Copper foil thickness reduction (μm) | — | 0.2 | <0.1 | 0.5 | 0.5 | 0.4 |

The ten substrates which had undergone the cleaning treatment of polishing (1) plus polishing (2) above were subjected to precision etching using a vertical etching machine manufactured by Tokyo Kakoki Co., Ltd. under the conditions shown below, thereby producing thin copper foil-clad circuit board substrates having a copper foil thickness of 9 μm.
  Etching solution
  $H_2O_2$ concentration: 2.1-2.4 w/v %
  $H_2SO_4$ concentration: 3.6-4.1 w/v % n-Propanol concentration: 2-4 w/v %
Copper concentration: 15-20 g/l
Etching conditions
Effective etching chamber length: 2.0 m
Temperature: 35°±1° C.
Spray pressure (for both sides): 1.0 kg/cm$^2$
Etching time: 92 sec
Conveyor speed: 1.3 m/min
Etching rate: 0.09 μm/sec The resulting etched substrates were treated by spraying a 0.01-0.05% aqueous solution of sulfuric acid on the substrates at room temperature, cleaned with a 1-5% aqueous solution of sulfuric acid, and then subjected to neutralization treatment in which a 5% aqueous solution of $Na_2CO_3$ was sprayed on the substrates at room temperature, followed by anti-corrosive treatment in which a 0.3% aqueous solution of benzotriazole was sprayed at 40° C. The thus-treated substrates were dried in hot air at 100° C.

All the ten thin copper foil-clad substrates obtained were examined for external defects including projections on copper foil surface. As a result, no defects were found. Further, each substrate was cut into nine pieces by dividing the substrate into three equal parts with respect to each of the length and width directions, and the thickness of each of the resulting 18 rectangular copper foils was measured at an arbitrary point. As a result, it was found that the copper foils had an average thickness of 8.9 μm, a maximum of 9.3 μm, and a minimum of 8.6 μm, with the thickness fluctuation on the basis of the average thickness being within ±0.4 μm and that on the basis of the desired thickness being within ±0.4 μm. It was also found that 95% of the measured thickness values were within the range of from 8.7 to 9.3 μm and the surface roughness was from 2.0 to 3.0 μm.

Furthermore, the thin copper foil-clad laminates obtained were allowed to stand at 25° C. under 60% RH for 30 hours, but no corrosion was observed. In the above-described copper foil thickness measurement, an eddy-current method was used.

While the invention has been described in detail and with reference to specific embodiments thereof, it will be apparent to one skilled in the art that various changes and modifications can be made therein without departing from the spirit and scope thereof.

What is claimed is:

1. A process for producing a thin copper foil-clad circuit board substrate which comprises subjecting a copper foil-clad circuit board substrate (a) comprising an electrically insulating support overlaid on one or both sides with a copper foil having an average thickness of 12 μm or more to etching with a copper-etching solution thereby to etch the whole surface of the copper foil at a predetermined etching rate selected from the range of from 0.01 to 0.4 μm/sec, thereby to reduce the thickness of the copper foil on at least one side of the insulating support to 10 to 80% of its original thickness with the thickness variation of the remaining etched copper foil being within ±1.0 μm on the basis of a desired thickness, wherein said copper foil-clad circuit board substrate (a) is one in which the surface of the copper foil is substantially free of adherent dust particles having an average particle diameter of 3 μm or more, wherein said adherent dust particles have been removed by a surface-polishing treatment comprising at least two steps.

2. A process as claimed in claim 1, wherein the thickness of copper removed by said surface-polishing treatment is 2 μm or less.

3. A process as claimed in claim 1, wherein at least the first step in said surface-polishing treatment is a mechanical polishing treatment.

4. A process as claimed in claim 3, wherein said mechanical polishing treatment is polishing with a #600-1,000 compressed pad brush.

5. A process as claimed in claim 2, wherein the final step in said surface-polishing treatment is polishing with a #1,000-1,200 compressed pad brush or polishing with jet scrubber employing a #180-400 abrasive material.

* * * * *